(12) United States Patent
Stojanovic et al.

(10) Patent No.: US 8,397,149 B2
(45) Date of Patent: Mar. 12, 2013

(54) METHODS FOR OBTAINING A SET OF PATH METRICS AND EQUALIZER FOR A RECEIVER FOR DIGITAL DATA

(75) Inventors: Nebojsa Stojanovic, Munich (DE); Stefan Langenbach, Nuremberg (DE)

(73) Assignee: Cisco Technology, Inc., San Jose, CA (US)

( * ) Notice: Subject to any disclaimer, the term of this patent is extended or adjusted under 35 U.S.C. 154(b) by 424 days.

(21) Appl. No.: 12/814,366

(22) Filed: Jun. 11, 2010

(65) Prior Publication Data

US 2011/0305270 A1 Dec. 15, 2011

(51) Int. Cl.
*H03M 13/03* (2006.01)
(52) U.S. Cl. ........................ 714/796; 714/794
(58) Field of Classification Search ...... 708/2; 382/168; 375/341; 398/208; 714/704, 796, 794
See application file for complete search history.

(56) References Cited

U.S. PATENT DOCUMENTS

| | | | | |
|---|---|---|---|---|
| 7,233,962 | B2 * | 6/2007 | Summerfield et al. | 708/2 |
| 7,471,825 | B2 * | 12/2008 | Rising et al. | 382/168 |
| 2006/0274861 | A1 * | 12/2006 | Langenbach et al. | 375/341 |
| 2008/0199191 | A1 * | 8/2008 | Essiambre et al. | 398/208 |
| 2009/0219983 | A1 * | 9/2009 | Gerfers et al. | 375/232 |
| 2010/0287423 | A1 * | 11/2010 | Stojanovic | 714/704 |

FOREIGN PATENT DOCUMENTS

| | | |
|---|---|---|
| EP | 1139619 A1 | 10/2001 |
| EP | 1 494 413 A1 | 1/2005 |
| EP | 1494413 A1 | 1/2005 |
| EP | 1693975 A1 | 8/2006 |
| EP | 956 744 A1 | 8/2008 |
| WO | WO 2008/098934 A1 | 8/2008 |

OTHER PUBLICATIONS

European Search Report received Feb. 2, 2011 in EP Application No. 10165593.4.
Oscar E. Agazzi et al., "Maximum-Likelihood Sequence Estimation in Dispersive Optical Channels", Journal of Lightwave Technology, vol. 23, No. 2, Feb. 2005, pp. 1-16.
Agazzo O. E., et al., "Maximum-Likelihood Sequence Estimation in Dispersive Optical Channels," Journal of Lightwave Technology, vol. A No. 2, Feb. 2005, pp. 749-763.
Elbers J,-P., et al., "Measurement of the Dispersion Tolerance of Optical Duobinary with an MLSE-Receiver at 10.7 Gbh/s" in Proc. OFC, Washington, 2005, OThJ4.
Farbert, A. et al., "Performance of a 10.7 Gb/S Receiver with Digital Equaliser using Maximum Likelihood Sequence Estimation" in Proc. ECOC, Stockholm, 2004, Th.4.1.5.
Forney, David G. Jr., "The Viterbi Algorithm," in Proc. of the IEEE, vol. 61, No. 3, Mar. 1973, pp. 268-278.

(Continued)

*Primary Examiner* — David Ton

(57) ABSTRACT

This invention relates to methods for obtaining a bin number of path metrics. When performing such methods, a histogram is provided, which comprises a bin number of values, a maximum value and a tail region left or right of the maximum value. A bin number of path metrics is obtained from said values. According to an embodiment a local extremum is removed from said tail region. According to another embodiment the tail region is forced to be convex. According to a further embodiment a maximum metric difference between neighboring metrics is ensured.

12 Claims, 7 Drawing Sheets

OTHER PUBLICATIONS

Forney, David G. Jr., "Maximum-Likelihood Sequence Estimation of Digital Sequences in the Presence of Intersymbol Interference" IEEE Transactions on Information Theory, vol. IT-18, No. 3, May 1972, pp. 363-378.

Haunstein, Herbert F. et al., "Principles for Electronic Equalization of Polarization-Mode Dispersion," Journal of Lightwave Technology, vol. 22, No. 4, Apr. 2004, pp. 1169-1182.

Langenbach S., et al., "Parametric versus Non-parametric Branch Metrics for MLSE-based Receivers with ADC and Clock Recovery," in Proc. OFC/NFOEC 2008, JThA60.pdf.

Trellises &Trelus, "The Viterbi Decoding Algorithm, in Proc. of the IEEE," Sec. 12.1-Sec. 12.5, 2003, pp. 291-323.

* cited by examiner

US 8,397,149 B2

METHODS FOR OBTAINING A SET OF PATH METRICS AND EQUALIZER FOR A RECEIVER FOR DIGITAL DATA

BACKGROUND OF THE INVENTION

The present invention relates to methods according to the preamble parts of claims 1, 2 and 5 and to an equalizer for performing such methods.

This invention relates to equalizing received digital data by a maximum likelihood sequence estimator (MLSE) and more specifically to obtaining branch metrics for a maximum likelihood sequence estimator.

The MLSE using the Viterbi-Algorithm (VA) bases its symbol decisions on probabilistic decision variables, i.e. branch and path metrics differences, that are ultimately related to conditional probabilities of observing a given received signal when a given symbol (or symbol sequence) has been sent.

The basis for computing the relevant sequence decision variables are the so-called branch metrics, which in turn are based on a probabilistic model of the channel defined by a set of amplitude probability density functions (PDFs) or probability mass functions (PMFs), one for each channel state, i.e. for each sent bit pattern of a certain length.

In essence, for the detection to best approximate a true maximum likelihood detector, the metrics should represent the log-likelihoods for the events to observe specific quantized amplitudes when given symbol sequences have been sent, i.e. when the channel was in given channel states.

In a practical system, the probabilistic channel model needs to be estimated in real-time and without channel-specific a-priori information. Moreover it needs to be updated in real-time in order to follow changing channel conditions e.g. due to drifts or due to dynamic effects such as polarization mode dispersion (PMD). This implies that the channel estimator needs to be blind and adaptive.

To learn or acquire the channel model at the beginning of operation, the channel estimator is initialized with a crude channel model, resulting in a high initial error rate.

Channel model estimation methods may be parametric or nonparametric (cf. H. F. Haunstein, W. Sauer-Greff, A. Dittrich, K. Sticht, and R. Urbansky, "Principles for electronic equalization of polarization-mode dispersion" *J. Lightwave Technol.*, vol. 22, pp. 1169-1182, April 2004, and cf. Langenbach, S.; Bosco, G.; Poggiolini, P.; and Kupfer, T., "Parametric versus Non-Parametric Branch Metrics for MLSE-based Receivers with ADC and Clock Recovery," Optical Fiber communication/National Fiber Optic Engineers Conference, 2008. OFC/NFOEC 2008, Conference on, Paper JThA60, 2008). When a parameterized functional form of the PDF is assumed, a parametric method estimates the PDF parameters and uses the functional form to compute the metrics. On the other hand, non-parametric methods do not assume knowledge of the PDF (cf S. Langenbach and N. Stojanovic, "Channel estimation and sequence estimation for the reception of optical signal", EP1 494 413 A1, Jan. 5, 2005 (later referred to as COEP4); A. Farbert, S. Langenbach, N. Stojanovic, C. Dorschky, T. Kupfer, C. Schulien, J.-P. Elbers, H. Wernz, H. Griesser, C. Glingener, "Performance of a 10.7 Gb/s receiver with digital equaliser using maximum likelihood sequence estimation," in *Proc. ECOC*, Stockholm, 2004, Th.4.1.5; J.-P. Elbers, H. Wernz, H. Griesser, C. Glingener, A. Faerbert, S. Langenbach, N. Stojanovic, C. Dorschky, T. Kupfer, C. Schulien, "Measurement of the dispersion tolerance of optical duobinary with an MLSE-receiver at 10.7 Gb/s," in *Proc.* *OFC*, Washington, 2005, OthJ4). COEP4 is zo incorporated herein by reference and cites further references.

FIG. 8 shows an optical receiver 10 which is essentially known from COEP4 and receives an analog input signal r(t) from an optical fiber 4. The receiver 10 comprises a physical interface (PI) 11, a AGC or variable gain amplifier (VGA) 12, an ADC 13, a clock recovery (CR) subsystem 14, a sampling phase adjustment (SPA) circuit 15, an MLSE 17, a FEC decoder 18, a channel model unit 19 and a receiver control node 9.

The physical interface 11 performs an optical-to-electrical (O/E) conversion. The physical interface (PI) uses either a pin diode or an avalanche photo diode to convert the incident optical power to an electrical current. A transimpedance amplifier (TIA) is used to amplify and convert the photocurrent to a voltage.

The analog serial signal data at the output of physical interface 11 is amplified by a high-gain high-dynamic, low-noise automatic gain control (AGC) or variable gain amplifier (VGA) circuit 12. The output signal of AGC 12 is designated $\tilde{r}(t)$:

The ADC 13 digitizes the analog signal $\tilde{r}(t)$ and outputs quantized data $y_{t,s}$. Index t refers to a time slot and index s refers to different sampling phases. Index s may assume the values 1 to S for S-fold oversampling. S may be be 2. The ADC 13 receives a sampling clock from SPA circuit 15 which in turn receives a sampling clock from clock recovery subsystem 14. The SPA circuit 15 operates as an adjustable delay in order to optimize the phase of the clock which is to say to optimize the sampling times of ADC 13.

The quantized data $y_{t,s}$ are input into MLSE 17. MLSE 17 may implement a Viterbi algorithm (VA) and outputs the most likely sequence designated detected data $u_t$ to FEC decoder 18. In a typical optical receiver, with a powerful FEC code used, the bit error rate at the output of MLSE 17 ranges e.g. from $10^{-2}$ to about $10^{-4}$. The subsequent FEC decoder 18 further reduces bit error rate to a range between $10^{-9}$ and $10^{-16}$ which is required for data transmission. FEC decoder 18 outputs decoded data $x_i$ for further processing. MLSE 17 and/or FEC 18 may obtain BER estimates and provide same to control node 9. Actually, the serial data output by the ADC are, in reality, de-multiplexed in the digital domain. Blocks 17, 18, 19, 9 all operate at lower speed.

Control node 9 receives a loss-of-signal (LOS) signal from physical interface 11 and may receive counter values or event frequency information from channel model unit 19 in order to obtain pre-processed statistics data for controlling the AGC-NGA circuit 12, CR 14 and SPA circuit 15. Counter values may also be referred to as bin values. Important for this invention is that the channel model unit 19 receives quantized data $y_{t,s}$. The channel model unit 19 further receives the present channel state $b_t$ and calculates and outputs branch metrics to the MLSE 17.

Returning to channel model estimation methods, we focus our interest on the non-parametric method, which uses empirical histograms being synonymous to empirical PMFs to obtain the branch metrics. This is generally called the histogram method (cf. O. E. Agazzi, M. R. Hueda, H. S. Carrer, and D. E. Crivelli, "Maximum-likelihood sequence estimation in dispersive optical channels", "*J. Lightwave Technol.*, vol. 23, pp. 749-763, February 2005). More specifically, when the measured histogram bin values representing relative frequencies are directly converted to metrics values, without further post-processing, we call it the canonical histogram method, as described in more detail in the following.

Canonical Histogram Method

The total number of channel state (i.e. bit pattern) conditioned histograms depends on the so-called channel length M, which is often called the channel memory and, in a practical implementation, may e.g. have a value of 3, 4, or 5. The total number of channel states is $2^M$ if an interference of M−1 bits with the current bit indexed by t is to be allowed for, i.e. when channels are projected to be covered which require a sequence of M bits to reasonably represent a channel state.

The received signal is quantized to K bits; therefore, each histogram consists of $2^K$ bins or counter values and is an empirical estimate for the amplitude PMF of the quantized output values. When the received signal is oversampled the number of histograms is proportional to oversampling factor S. In contemplated embodiments S=2.

Each histogram is uniquely associated with a channel state $b_1$, and hence with a branch in the trellis of the Viterbi detector.

Let us denote the quantized sample values by $y_{t,s}$, $1 \leq y_{t,s} \leq 2^K$, s=1, 2, ..., S. The counter values $c_{i,j,s}$ constitute event counts when $i=y_{t,s}$ and the channel is in state j, j=1, 2, ..., $2^M$ during a collection time T. The counter values $c_{i,j,s}$ may be grouped to histograms $h_{j,s}$, which are uniquely associated to channel states j and the sampling phases s. When the number of samples collected is large enough, the normalized histogram is an estimate of conditional probability $P=(i=y_{t,s}/h_{j,s})$:

$$P(i = y_{t,s}/h_{j,s}) = \frac{c_{i,j,s}}{\sum_{i=1}^{2^K} c_{i,j,s}}, \quad (1)$$

$$i = 1, 2, \ldots, 2^K, j = 1, 2, \ldots, 2^M, s = 1, 2, \ldots, S$$

One immediately notes that the conditional probabilities $P(i=y_{t,s}/h_{j,s})$ are normalized and may be considered as normalized histograms:

$$\sum_{i=1}^{2^K} P(i = y_{t,s}/h_{j,s}) = 1, j = 1, 2, \ldots, 2^M, s = 1, 2, \ldots, S \quad (2)$$

This conditional probability $P(i=y_{t,s}/h_{j,s})$ is used in the trellis for the best path calculation. To avoid multiplication in the searching of the best trellis path, the conditional probability is replaced by the absolute value of the logarithm of the conditional probability, and addition is used instead of multiplication. Further details of the metric calculation are comprised in COEP4.

In practical systems, metrics are quantized to L bits. It means that log probability can take value from 0 to $2^L-1$. Additionally, receiver designers have to specify the minimum probability that should be quantized, $P_{min}$. We may define:

$$\Lambda_{i,j,s} := \log(P(i=y_{t,s}/h_{j,s})), \Lambda_{i,j,s} \leq 0 \quad (3)$$

$$\Lambda_{min} := \log(P_{min}). \quad (4)$$

When $\Lambda_\delta := \Lambda_{min}/(2^L-1)$ the metrics quantization rule is defined by $$bm(i) = bm_{i,j,s} = \begin{cases} 0, & \Lambda_{i,j,s} \geq \Lambda_\delta \\ l, & l\Lambda_\delta > \Lambda_{i,j,s} \geq (l+1)\Lambda_\delta \\ 2^L-1, & (2^L-1)\Lambda_\delta > \Lambda_{i,j,s} \end{cases} \quad (5)$$

The branch metric $bm_{i,j,s}$ still depends on the sampling phase index s. How this dependency may be handled is described in COEP4.

Disadvantages of the Non-Parametric Channel Model Estimation

There are two problems that are more or less specific to the canonical histogram method: error propagation by PMF tail shape corruption, and metrics indifference. Both can cause performance degradation against perfect channel training which means that the sent sequence is known to the receiver.

Error Propagation

The real-time channel estimation is decision-directed and as such suffers from the errors at the detector output. This results in histograms that do not faithfully represent the true channel conditions. Due to this circular dependency between metrics and channel estimations, decision errors cause wrong estimations and these, via the derived metrics, can cause further errors in future decisions. This problem is called error propagation.

In principle, error propagation also occurs in parametric methods. However, the influence of decision errors on parameter estimates such as histogram mean values may be expected to be weaker, since, even under estimation error, at least the shape of the PDF is maintained.

There are several situations in which error propagation can be detrimental. The general pattern here is that a temporarily high error rate might lead to a self-stabilized error propagation loop, with a residual error rate higher than that achieved with a trained channel model, i.e. a channel model without decision errors:

1. In low noise situations (high optical signal-to-noise ratio (OSNR)), low-probability random decision errors create events in normally un-occupied histogram bins corresponding to the PMF tails. This can lead to large metrics changes, which influence the decisions in the next interval.
2. At the beginning of a channel model acquisition from crude starting channel models, the initial error rate is high, which enhances the chances of meta-stable error propagation. The MLSE may then converge to a wrong channel model.
3. Transient or modal disturbances caused for example by channel changes, temperature variations, power supply instability and jitter may result in histograms that still lead to a high error rate after the disturbance has disappeared. For example, short-time unpredictable processes can produce histograms that degrade BER performance even long time after such processes have disappeared.

Metrics Indifference

Metric indifference refers to a situation, where events with significantly different conditional probabilities are assigned the same or similar metrics. The branch metrics differences used by the VA do not represent the true log-likelihood ratio anymore. The resulting path metrics error misguides the decisions of the VA and degrades MLSE performance.

1. One source of metric indifference is the lack of observation data for low probability events especially in the tails of the PDFs: In practice, the channel model must be updated after a finite channel estimation period. At high OSNR some histogram bins in the PDF tail region will remain empty, because the probability of observing the relevant events is too small. The canonical histogram method assigns the same metrics to such unobserved bins even if the true metrics difference should be large. This may cause an error floor due to metric indifference.
2. Another source of metric indifference is the finite log-likelihood quantization range and resolution in a practical metrics computer, which is described by the parameters K, L and $P_{min}$. A practical implementation must choose a fixed metrics quantization range, $P_{min}$. However, in low noise situations, the histogram bins with probabilities less than $P_{min}$ will often be empty and will therefore obtain the same metrics, again causing metric indifference and resulting in an error floor. Note that this problem cannot be solved by choosing a longer channel estimation period, because even if one was able to correctly estimate very low probabilities, bins with observed relative frequencies smaller than $P_{min}$ would have got the same quantized branch metrics.

Prior Solutions

The above-identified disadvantages have not yet been discussed in the literature, and prior art solutions are unknown to the inventors.

The technical literature on channel estimation for MLSE covers mainly parametric methods.

With regard to non-parametric methods, only the canonical histogram method is usually discussed. Drawbacks of the canonical method other than the problem of longer measurement duration for the same statistical significance have not been discussed.

The performance of MLSE equalizers with non-parametric channel model estimation at low bit error rates is not accessible to simulations and is therefore neglected in the simulation-based literature.

Nevertheless reference should be made to N. Stojanovic "Tail Extrapolator and Method" EP application No. 07102182.8 and PCT application PCT/EP2008/051684, publication projected in August 2008. This reference discloses "tail extrapolation", which is some kind of post-processing of canonical histograms in order to set low probability bins or metrics to reasonable values. EP07102182.8 is incorporated herein by reference.

It is the object of this invention to provide improved methods for obtaining a set of path metrics and an equalizer implementing such methods.

This object is achieved by the subject matter of the independent claims.

Preferred embodiments of the invention are the subject matter of the dependent claims.

BRIEF DESCRIPTION OF THE DRAWINGS

In the following preferred embodiments of this invention are described referring to the accompanying drawings. In the drawings.

Figure 1:
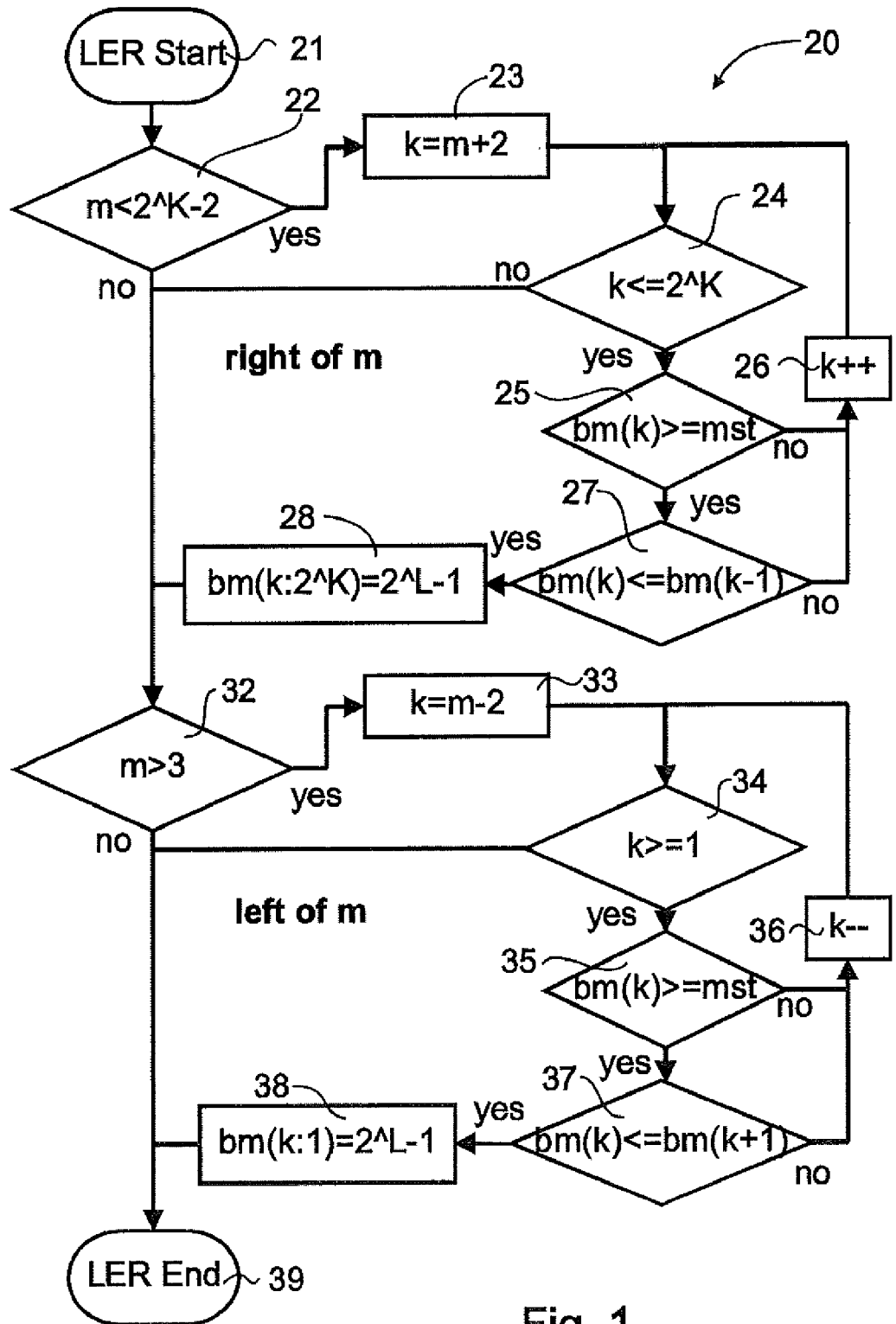
FIG. 1 illustrates the LER processing.

| Abbreviations | |
|---|---|
| ADC: | Analog-to-Digital Converter |
| AGC: | Automatic Gain Controller |
| BER: | Bit Error Rate |
| BM: | Branch Metrics |
| BMC: | Branch Metrics Computation |
| CR: | Clock Recovery |

| Abbreviations (continued) | |
|---|---|
| CTE: | Convex Tail Enforcement |
| DDMS: | Distance Dependent Metrics Slope |
| DGD: | Differential Group Delay |
| FEC: | Forward Error Correction |
| HCNTACC: | Histogram Counter Accumulation |
| HMODE: | Histogram Mode Value |
| HNORM: | Histogram Normalization |
| LER: | Local Extremum Removal |
| MMVA: | Minimized Method Viterbi Algorithm |
| MLSE: | Maximum Likelihood Sequence Estimator |
| NRZ: | Non-Return-to-Zero |
| OFE | optical front-end |
| OSNR: | Optical Signal-to-Noise Ratio |
| PDF: | Probability Density Function |
| PI: | Physical Interface |
| PMD: | Polarization Mode Dispersion |
| PMF: | Probability Mass Function (Histogram) |
| RD: | Residual Dispersion |
| SPA | Sampling Phase Adjustment |
| TIA | transimpedance amplifier |
| VA: | Viterbi Algorithm |
| VGA | Variable gain amplifier |

| Mathematical Symbols | |
|---|---|
| amd(n) | allowed metric delta |
| bm(i) | branch metrics |
| $b_t$ | channel state |
| $c_{i,j,s}$ | counter value |
| $h_i$ | histograms |
| i | index, $1 \leq i \leq 2^K$ |
| j | channel state index, $1 \leq j \leq 2^M$ |
| K | resolution of ADC in bits |
| k | index, $1 \leq i \leq 2^K$ |
| L | metric resolution in bits |
| I | index, $0 \leq I \leq 2^L - 1$ |
| $\Lambda_{i,j,s}$ | metric |
| $\Lambda_\delta$ | quantization step for metric |
| M | channel length/channel memory |
| m | minimum metric index |
| n | index, $1 \leq n \leq 2^K$ |
| o | index, $1 \leq o \leq 2^K$ |
| mst | metric smoothing threshold |
| mmdt | maximum metric delta template |
| mtms | minimum tail metric slope parameter |
| pmd | progressive metric delta parameter |
| $P_{min}$ | minimum probability |
| $P(y_i/h_j)$ | conditional probability |
| S | oversampling factor |
| s | phase index, $1 \leq s \leq S$ |
| T | collection time |
| t | time slot index |
| $t_c$ | time slot counter index |
| $y_{t,s}$ | quantized symbol values |

While the present invention is described with reference to the embodiments as illustrated in the following detailed description as well as in the drawings, it should be understood that the following detailed description as well as the drawings are not intended to limit the present invention to the particular illustrative embodiments disclosed, but rather the described illustrative embodiments merely exemplify the various aspects of the present invention, the scope of which is defined by the appended claims.

The metrics resulting from the canonical histogram method are post-processed. The post-processing efficiently copes both with metrics artifacts in the PMF tail regions, which are a result of error propagation, and with metrics indifference situations.

In using (rough) a priori knowledge of PDF (or PMF) tail shapes (such as logarithmic PMF being monotonically decreasing, convex, or not arbitrarily steep), our method can be interpreted as a pragmatic hybrid between truly non-parametric and parametric methods.

It is clear that in addition to those mentioned in this report, other known "features" of PDF (or PMF) shapes can be used to replace canonical metrics derived from unreliable histogram tails by "extrapolated" metrics.

Unlike with many parametric methods, computationally intensive, numerically demanding methods such as PDF evaluations or PDF integrations (for PMF evaluation) are not required.

We have invented three computationally simple methods for branch metrics post-processing:

Clearing unreliable bins that might be caused by error propagation.

Ensuring that the metrics slope related to the tails of a logarithmic histogram is always non-decreasing which is characteristic for most relevant PMF families such as Gaussian or chi-square.

Ensuring maximum metric slope in order to avoid metric indifference far from the histogram center.

Extrapolation of cleared unreliable bins and metric slope control are based on a priori knowledge of rough, qualitative metrics vector shape.

The post-processing methods may operate on the quantized log probabilities, i.e. on branch metrics. From now on, we refer to a set of branch metrics being calculated from a single histogram as a metrics vector, which consequently consists of $2^K$ branch metrics $bm(i)=bm_{i,j,s}$, $i=1, 2, \ldots, 2^K$ that can take one of $2^L$ values from 0 to $2^L-1$. $bm(i)$ are still indexed by j and s, but this is irrelevant for the invention post-processing methods and will not be explicitly mentioned anymore. The highest probability corresponds to branch metric equal to 0. Each histogram and the corresponding metrics vector is characterized by the location of the bin with the minimum metric corresponding to the highest probability. This location is denoted by index m, $m=1, 2, \ldots, 2^K$ and also referred to as histogram or metrics vector center. When more than one minimum metric location is found the one with the lowest index m is declared as the minimum location and metrics vector center.

Local Extremum Removal—LER

The purpose of local extremum removal (LER) is to clear local extrema and the entire tail. The tail is considered unreliable and will later be reconstructed by the distance-dependent-metric-slope method (DDMS), which will be described below. A metric smoothing threshold mst is used to ensure that only tails with sufficiently low probability are handled. When $m=3$ or $m=2^K-2$ the method maintains an extremum in the first or last bin if existent, respectively, that is likely caused by high tail probabilities. In the following, MATLAB or Scilab 4.0 code will be printed in Courier, a non-proportional font without serifs. LER code for the tail right of metrics vector center may read:

```
if m < 2^K-2
    for k = (m + 2):2^K
        if bm(k) <= bm(k-1) & bm(k) >= mst
            bm(k:2^K) = 2^L-1; break;
        end
    end
end
```

LER code for the tail left of metrics vector center may read:

```
if m > 3
    for k = (m - 2):-1:1
        if bm(k) <= bm(k+1) & bm(k) >= mst
            bm(1:k) = 2^L-1; break;
        end
    end
end
```

The LER code is illustrated by FIG. 1. Step 21 marks in the starting point and step 39 marks the end point of the LER code. The directions left and right refer to diagrams in which the index of the bins or corresponding metrics is plotted on the abscissa. In step 22 it is checked as to whether there are enough bins right of the metrics vector center m. If this is not the case, a maximum in the last bin indexed $2^K$ is to be maintained. If $m<2^K-2$, the loop variable k is initialized with m+2 in step 23. This loop consists of steps 24 to 28. While $k<=2^K$, the loop is continued in step 24. Otherwise the loop is aborted in step 24. Only if a metric bm(k) exceeds or is equal to a metric smoothing threshold mst, which is checked in step 25, the bin k is further examined in step 27. Otherwise the loop variable k is incremented in step 26 and the loop proceeds to the next metric, if available. In step 27 local minima are detected. If two neighboring metrics in the tail have the same value, this is also interpreted as a local minimum. If it is determined in step 27 that the metric k is not bigger than the previous metric k−1, all metrics from index k to the last index $2^K$ are set to the maximum metric value $2^L-1$ in step 28 and the loop is aborted.

Steps 32 to 38 illustrate LER processing for the left-hand tail, which is mirror-like to the LER processing of the right-hand tail illustrated by steps 22 to 28. The reference numbers of like steps differ by 10.

Figure 2:
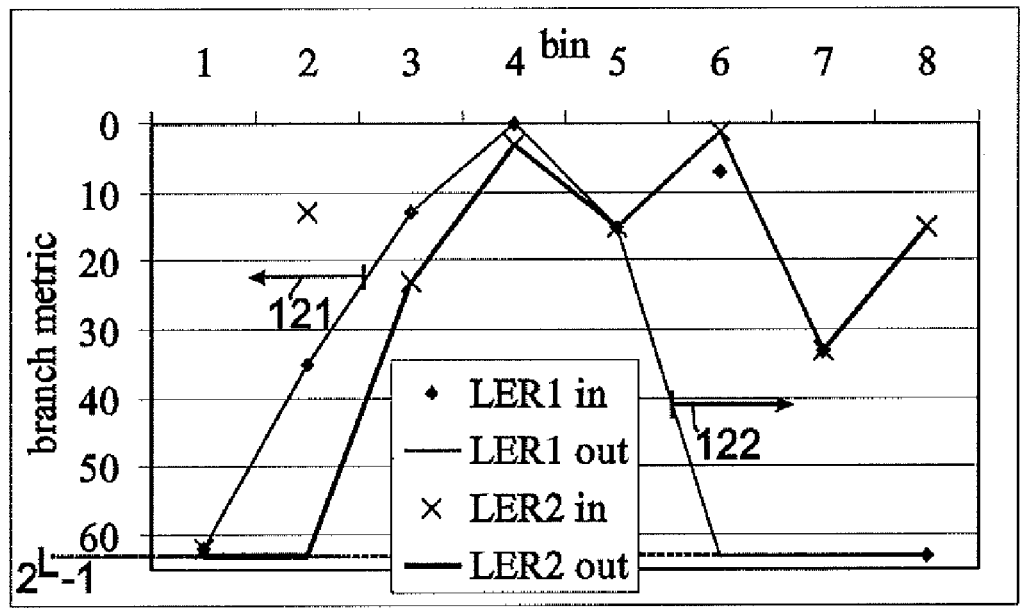
FIG. 2 illustrates two metrics vectors processed by LER.

Step 32 maintains a minimum in the first bin, if the metrics vector center is close to the first bin 1. The loop variable k is initialized with m−2 in step 33. The loop is aborted in step 34, when the first metric has been processed. Step 35 makes sure that only metrics exceeding or being equal to the metric smoothing threshold mst are processed. If a metric bm(k) is not bigger than the previous metric bm(k+1), which is checked in step 37, all metrics from k to 1 are set to maximum metric value $2^L-1$ in step 28 and the loop is aborted. If the loop is not aborted, the loop variable k is decremented in step 36. The following two examples are shown in FIG. 2.

TABLE 1

| example for K = 3, L = 6 and mst = 5 | | | | | | | |
|---|---|---|---|---|---|---|---|
| Input bm | 62 | 35 | 13 | 0 | 15 | 7 | 33 | 63 |
| Output bm | 62 | 35 | 13 | 0 | 15 | 63 | 63 | 63 |

TABLE 2

| example for K = 3, L = 6 and mst = 5 | | | | | | | |
|---|---|---|---|---|---|---|---|
| Input bm | 62 | 13 | 23 | 3 | 15 | 1 | 33 | 15 |
| Output bm | 63 | 63 | 23 | 3 | 15 | 1 | 33 | 15 |

Convex Tail Enforcement—CTE

Convex Tail Enforcement (CTE) ensures that the metrics slope on the tails of a metrics vector is always increasing to ensure strict convexity. Using a progressive metric delta parameter pmd, a slope increase towards the tails can be forced. Using a minimum tail metric slope parameter (mtms) it can be ensured that the tail region begins with a given minimum slope. Using the metric smoothing threshold parameter mst it can be ensured that changes are only applied to low probably bins in the tail regions.

CTE code for the tail right of metrics vector center may read:

```
if m < 2^K-2
    for i = max(4, (m + 2)): 2^K
        if bm(i) >= mst
            bm(i) = min(2^L-1, max(bm(i), bm(i-1) + max(bm(i-1)-bm(i-2),mtms) + pmd) );
        end
    end
end
```

CTE code for the tail left of metrics vector center may read:

```
if m > 3
    for i = min(2^K-3, (m - 2)):-1:1
        if bm(i) >= mst
            bm(i) = min(2^L-1, max(bm(i), bm(i+1) + max( bm(i+1) - bm(i+2),mtms) + pmd) );
        end
    end
end
```

Figure 3:
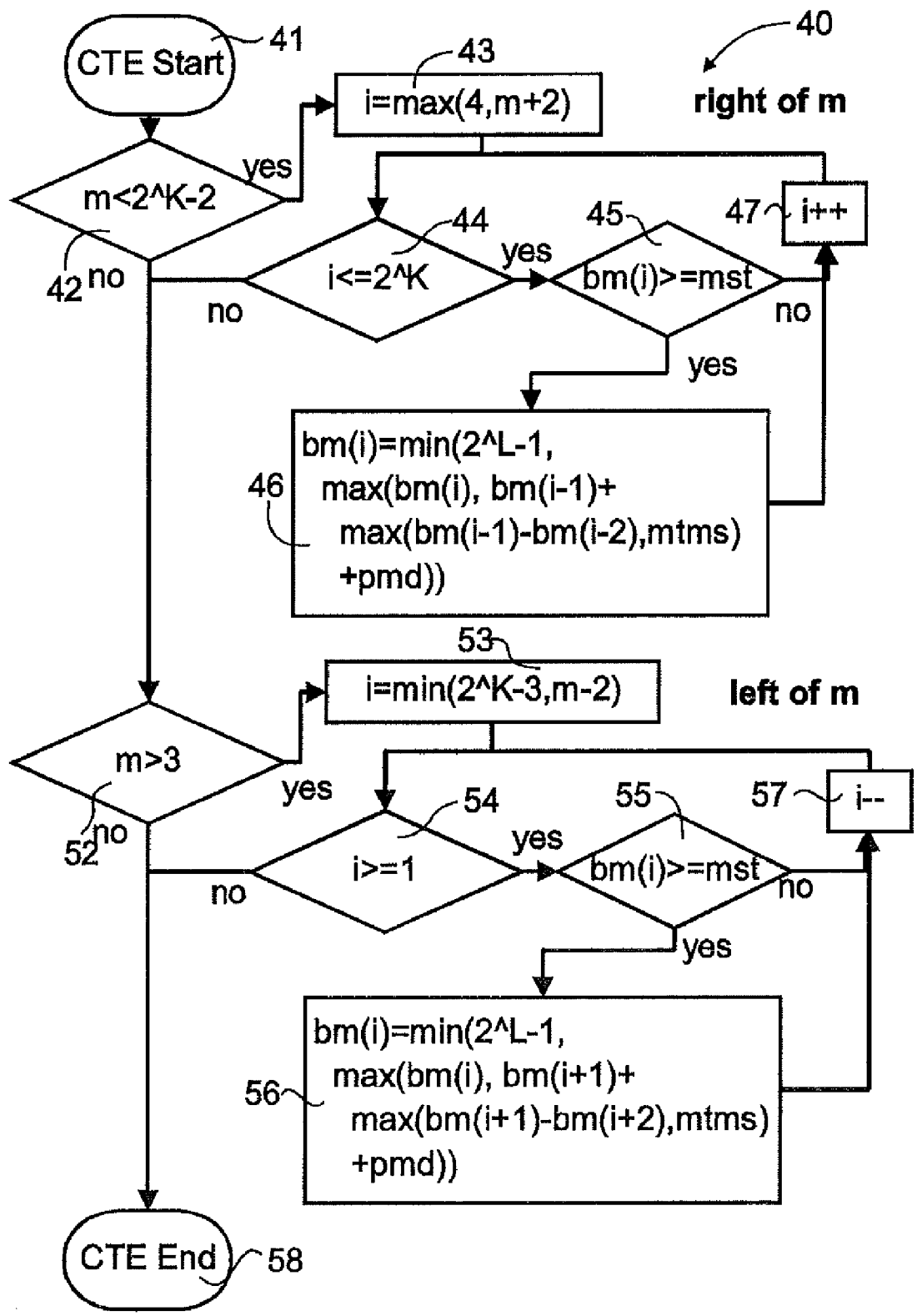
FIG. 3 illustrates the CTE processing.

The FIG. 3 illustrates CTE processing, which basically consists of two loops. The steps 43 to 47 form the loop for processing the right-hand tail and the steps from 53 to 57 form the loop for processing the left-hand tail. The reference numbers of like steps differ by 10.

The step 41 marks the beginning of CTE processing and the step 58 marks the end of CTE processing. The steps 42 and 52 check as to whether the metrics vector center m is not close to the last or first bin, respectively. If the metrics vector center m is close to the first or last bin, a left-hand or right-hand tail, respectively, does not exist and is consequently not processed.

The loop variable i is initialized in step 43 by the maximum out of 4 and m+2. If the last bin $2^K$ has been reached, which is examined in step 44, the loop for the right-hand tail is aborted. Step 45 makes sure that only metrics exceeding or being equal to the metric smoothing threshold mst are processed. The step 46 does several things: It makes sure that the metric difference between neighboring metrics bm(i) and bm(i−1) and neighboring metrics bm(i−1) and bm(i−2) increases by a progressive metric delta parameter pmd towards the last bin $2^K$. Further it makes sure that the tail starts with a minimum tail metric slope parameter mtms. Finally the step 46 makes sure that the metric bm(i) does not exceed the maximum metric value $2^L-1$. The function min selects the minimum out of its arguments separated by commas. The function max selects the maximum out of its arguments. The loop variable i is incremented in step 47 after each loop cycle.

Figure 4:
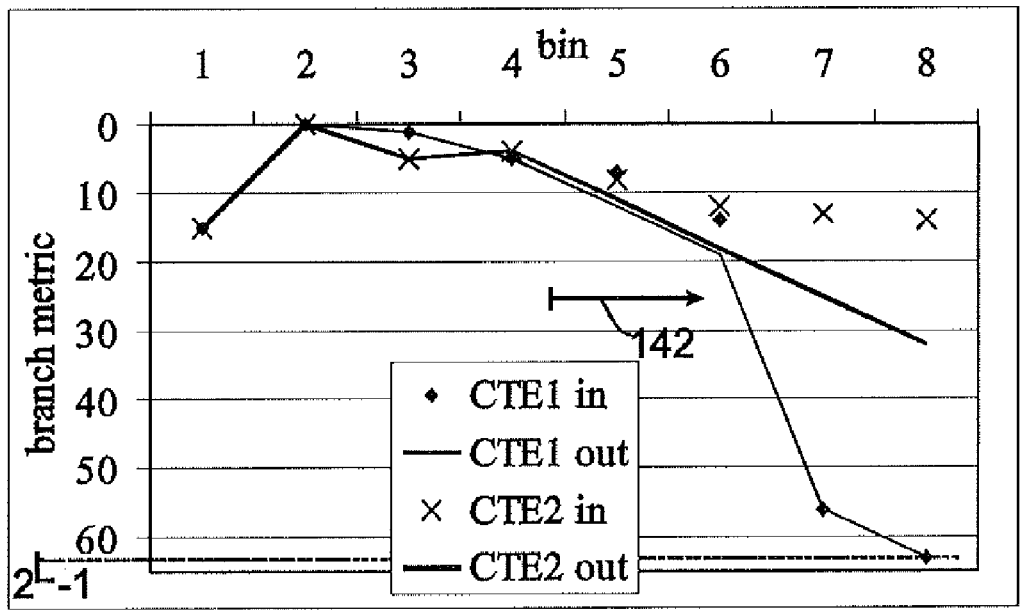
FIG. 4 illustrates two metrics vectors processed by CTE.

For processing of the left-hand tail, the loop variable i is initialized with the minimum out of $2^K-3$ and m−2. After the first metric has been processed, the loop is exited in step 54. Step 45 makes sure that only metrics exceeding or being equal to the metric smoothing threshold mst are processed. The step 56 makes sure that the metric difference increases by a progressive metric delta parameter pmd towards the first bin 1, the tail starts with a minimum tail metric slope parameter mtms and the metric bm(i) does not exceed the maximum metric value $2^L-1$. The loop variable i is decremented in step 57 after each loop cycle. The following two examples are shown in FIG. 4.

TABLE 3 example for K = 3, L = 6, mst = 5, pmd = 1, and mtms = 6

| Input bm | 15 | 0 | 1 | 5 | 7 | 14 | 56 | 63 |
| Output bm | 15 | 0 | 1 | 5 | 12 | 19 | 56 | 63 |

TABLE 4 another example for K = 3, L = 6, mst = 5, pmd = 1, and mtms = 6

| Input bm | 15 | 0 | 5 | 4 | 8 | 12 | 13 | 14 |
| Output bm | 15 | 0 | 5 | 4 | 11 | 18 | 25 | 32 |

Distance Dependent Metric Slope—DDMS

The Distance Dependent Metric Slope (DDMS) criterion ensures a maximum metric slope, which may depend on the distance to the metrics vector center m, in order to avoid metric indifference far from the metrics vector center m. However, in the examples presented, the maximum metric slope does not depend on the distance to the metrics vector center m. A maximum metric delta template mmdt is a vector of $2^K$ elements that defines a maximum metric difference between neighboring bins. In general, the maximum metric difference template elements may have different values. However, in the examples presented, the same value is assigned to all elements of the maximum metric difference template mmdt.

DDMS Code:

```
for n = 1:2^K        // for each amplitude
    amd(n) = mmdt(abs(m-n)+1); // allowed metric delta at distance
for o = 2:2^K
    bm(o) = min(bm(o), bm(o-1) + amd(o));
end
for o = 2^K-1:-1:1
    bm(o) = min(bm(o), bm(o+1) + amd(o));
end
```

Figure 5:
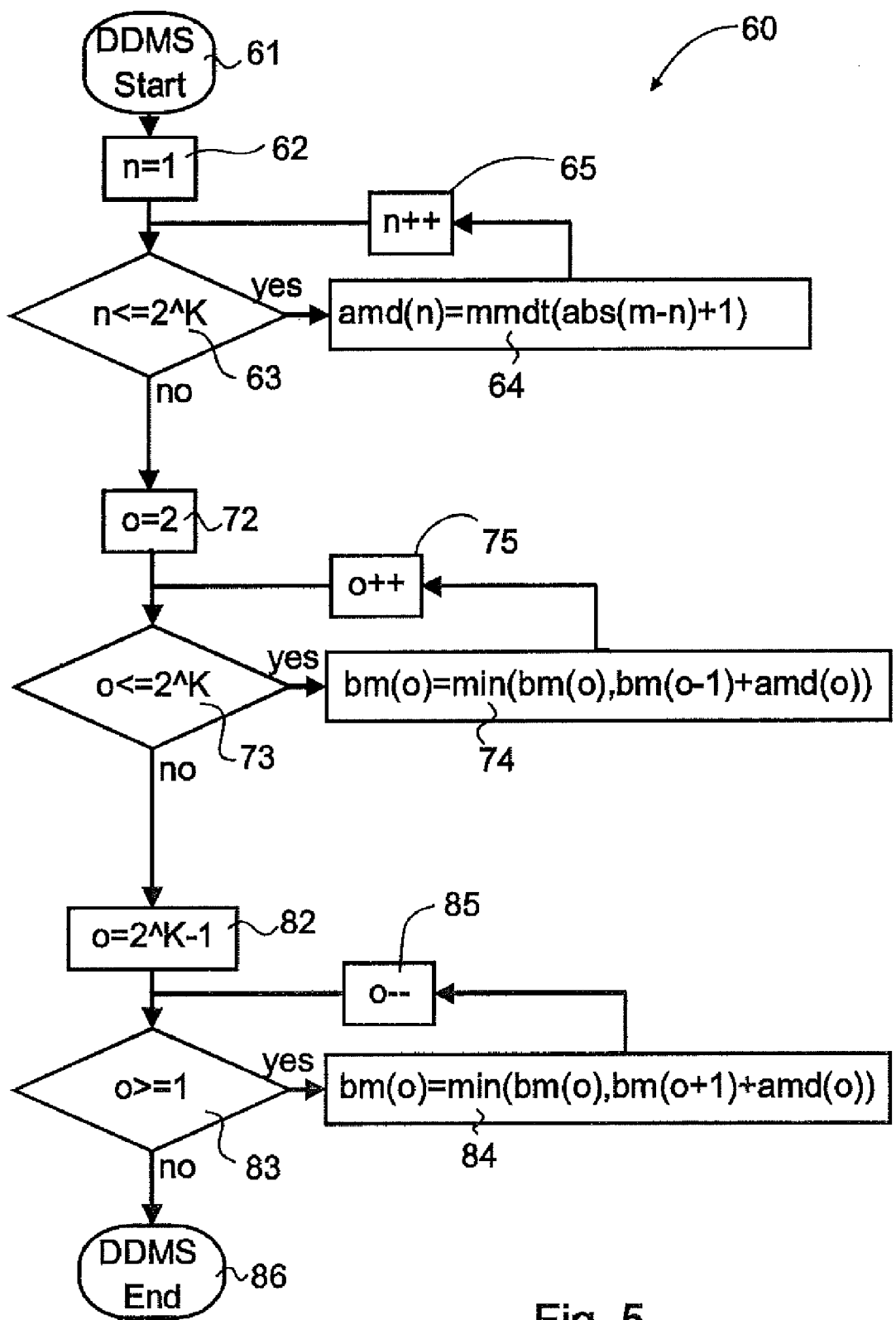
FIG. 5 illustrates the DDMS processing.

The DDMS processing is illustrated in FIG. 5. Steps 61 and 86 mark the starting and end point, respectively, of the DDMS processing. In a first loop, which comprises the steps 62 to 65, an allowed metric delta vector amd is initialized symmetrically to the metrics vector center m from the maximum metric delta template mmdt. The function abs in step 64 returns the absolute value of its argument. The steps 62, 63 and 65 manage this loop. The loop variable n is initialized in step 62 with 1. The loop is aborted in step 63 if the loop variable n exceeds $2^K$. The loop variable is incremented in step 65.

Instead of initializing all entries of the maximum metric delta template mmdt with the same value, all elements of the allowed metric delta vector amd may be initialized with this value thereby bypassing steps 62 to 65.

The loop which comprises steps 72 to 75 makes sure that the metric bm(o) does not exceed its left neighbor bm(o−1) by more than the allowed metric delta amd(o). The latter is specifically done in step 74. The steps 72 and 75 initialize and increment the loop variable o. The step 73 ensures proper loop exit.

Figure 6:
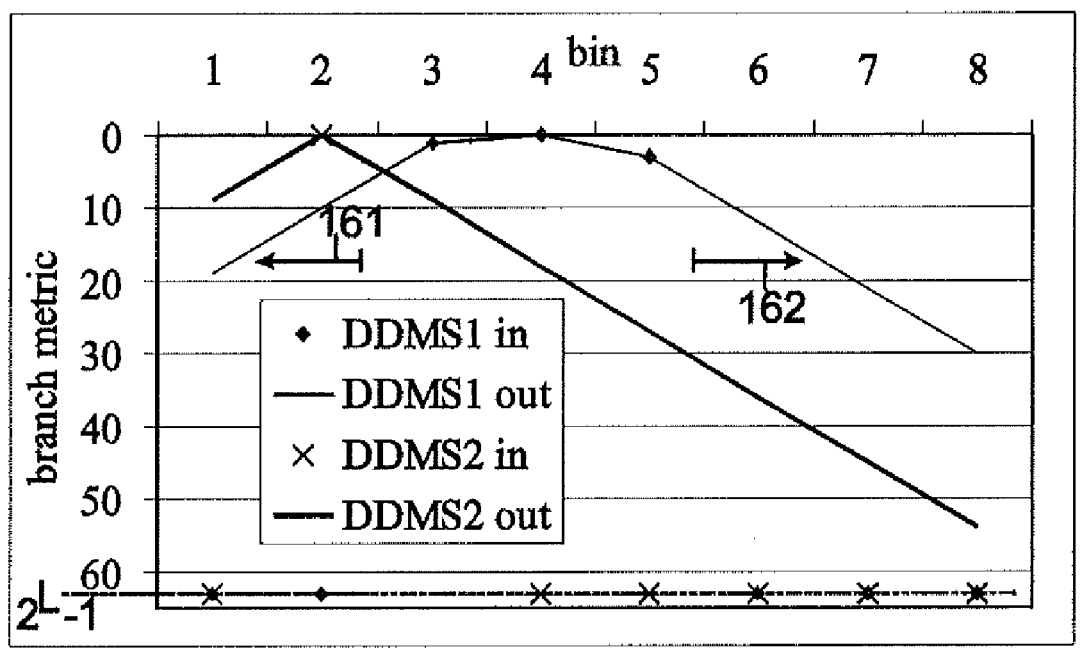
FIG. 6 illustrates two metrics vectors processed by DDMS.

The loop which comprises steps 82 to 85 makes sure that the metric bm(o) does not exceed its right neighbor bm(o+1) by more than the allowed metric delta amd(o). The latter is specifically done in step 84. The steps 82 and 85 probably initialize and decrement the loop variable o. The step 83 ensures proper loop exit. The following two examples are shown in FIG. 6.

TABLE 5 example for K = 3, L = 6, and mmdt(:) = 9.

| Input bm  | 63 | 63 | 1 | 0 | 3 | 63 | 63 | 63 |
|-----------|----|----|---|---|---|----|----|----|
| Output bm | 19 | 10 | 1 | 0 | 3 | 12 | 21 | 30 |

TABLE 6 another example for K = 3, L = 6, and mmdt(:) = 9.

| Input bm  | 63 | 0 | 44 | 63 | 63 | 63 | 63 | 63 |
|-----------|----|---|----|----|----|----|----|----|
| Output bm | 9  | 0 | 9  | 18 | 27 | 36 | 45 | 54 |

Implementation Overview

Figure 7:
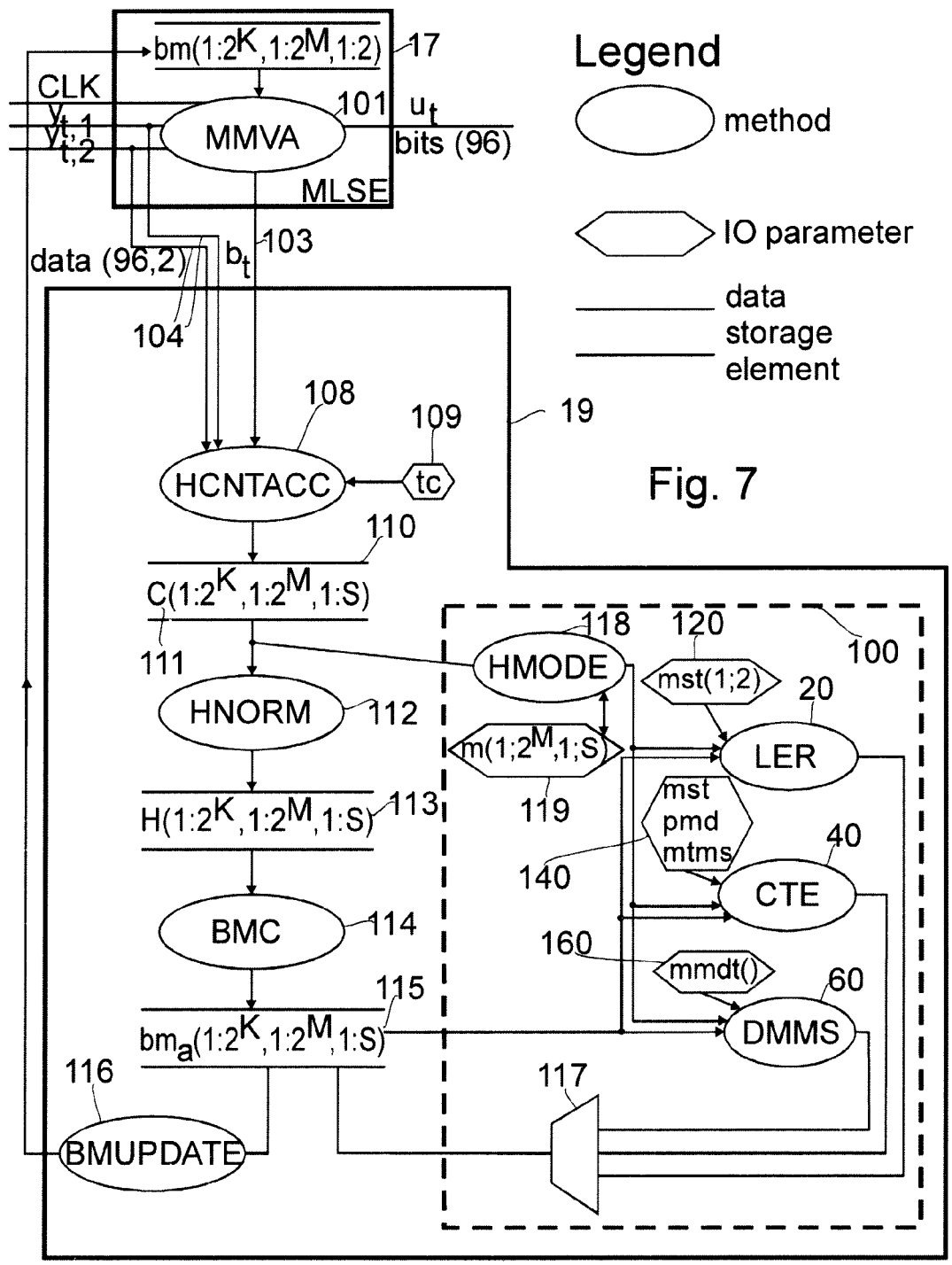
FIG. 7 illustrates an inventive channel model unit.
Figure 8:
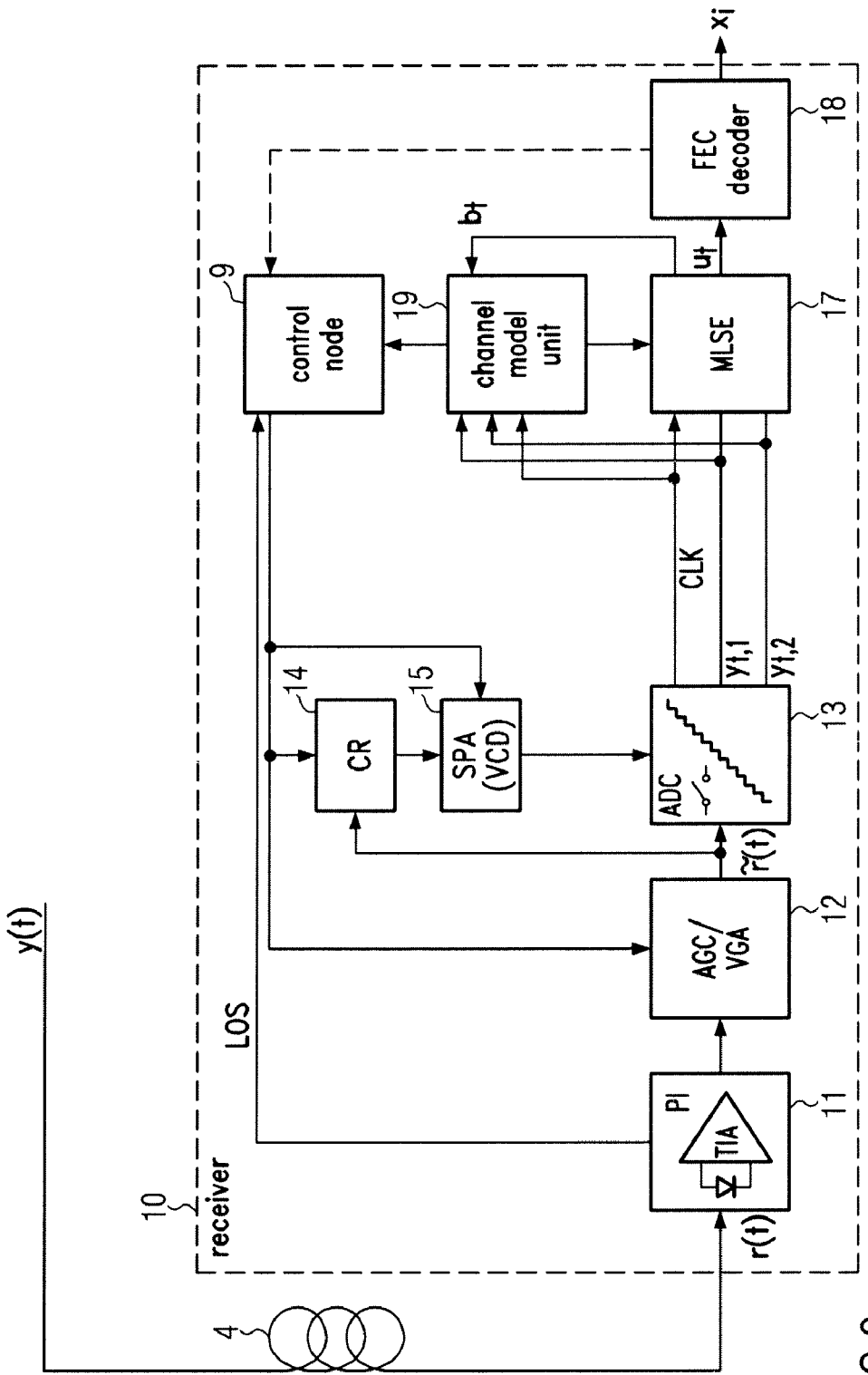
FIG. 8 shows a conventional receiver.

FIG. 7 shows a data flow block diagram of an inventive channel model unit 19 together with MLSE 17. Within channel model unit 19, the metrics post-processing box 100 encompasses the inventive elements LER 20, CTE 40 and DDMS 60. MLSE 17 comprises e.g. a modified Minimized Method Viterbi Algorithm (MMVA) 101 for parallel Viterbi decoding and branch metrics storage element 102. The MMVA, as for example described in H. Dawid, G. Fettweis, H. Meyr: A CMOS IC for Gb/s Viterbi Decoding: System Design and VLSI Implementation, IEEE Transactions on VLSI Systems, Vol. 4, No. 1, pp. 17-31, 10 Mar. 1996, is essentially modified to operate on two samples per bit. This requires another branch metric table for the second sampling phase, such that the MMVA comprises a branch metric table for each sampling phase, and a modified branch metrics computation where the independent metrics for two samples per bit are added to form the overall metrics for each transition.

The MMVA 101 receives blocks of 96 sample duads. Such blocks comprise quantized symbol values $y_{t,s}$ from ADC 13. The MMVA 101 further receives the clock CLK and the branch metrics from storage element 102. The MMVA 101 mainly outputs blocks of 96 detected bits also referred to as $u_t$ and further provides the associated channel states 103 also referred to as $b_1$ to the Histogram Counter Accumulation (HCNTACC) process 108 for performing event counting as explained in connection with equation (1).

The channel data accumulation period for the HCNTACC process 108 shall be controlled by the parameter $t_c$ 109, which denotes the number of bits collected into a counter-based channel model, i.e. the sum of all counter values of the channel model is equivalent to $S \cdot t_c$. To simplify Histogram Normalization (HNORM) 112, the data accumulation period synonymous to collection time and observation time T is given by $t_c$*(bit period). Bit period, symbol period and unit interval may be used synonymously. $t_c$ may be a power-of-two multiple of some minimum value of $t_c$. The minimum value of $t_c$ is for example larger than $2^{15}$ or $2^{12}$. The maximum value of $t_c$ is for example not smaller than $2^{32}$. The intention of this range is to allow fast acquisition and tracking, software-based processing at about 100 ... 1000 Hz. In another embodiment, the maximum value of $t_c$ may not be smaller than $2^{22}$. Simulations suggest that 4096=$2^{12}$ bits would be sufficient for fast acquisition i.e. 128 clock cycles at 64 bit block size with subsampling factor 2. This relaxed requirement is balanced against implementation restriction i.e. reduced power dissipation.

The process steps following HCNTACC 108 within channel model unit 19 are activated sequentially in a data-driven manner, i.e. when the preceding step has produced new and complete output data. The speed of the entire metrics update loop is therefore gated by the configured channel observation period of length $t_c$. Depending on configuration parameter $t_c$, the update speed of the operational metrics 102 can vary by orders of magnitude from "as fast as possible" (10 μs-100 μs) range to "very slow" updates (10-1000 s). Note that, in a practical system, software can stop processing at each stage and can read and write the channel model memories 110, 113, 115.

This is to support start-up of the long term channel observation based metrics computation policy; in steady state, the updates will be slow, but during start-up a gradual increase is desired.

The dynamic range of frequency variables C and H shall be large enough to represent the maximum number of collected bits of $10^{15}$ with a resolution of $10^{-6}$ (or $2^{-20}$). This means that observations of an interval of about 100 μs length can be accurately represented in counters. A dynamic range of $2^{50} > 10^{15}$ has been selected for frequency variables C and H.

The channel estimation process shall by default start after update of operational branch metrics. There may be a short hold-off period to avoid using data from metrics transition in channel estimation.

There shall be an option for channel estimation restart without counter initialization. Normally, counters are reset to zero at the beginning of a channel observation. The incremental restart allows software to incrementally update operational metrics during starting-up a periodical long-term channel estimation.

HNORM 112 implements equation (1), wherein counter histograms $C(i, j, s), i=1, \ldots 2^K$ for fixed j and s are normalized as relative frequency histograms and where the result is provided as $H(i, j, s) = P(i=y_{t,s}/h_{j,s})$. Histogram normalization of non-empty counter histograms implies $$1 = \sum_{k=1}^{2^K} H_{k,j,s}$$

for all j and s. Note that the occurrence of empty counter histograms normally is a defect condition that can be handled in application dependent ways.

The Branch Metrics Computation (BMC) 114 essentially implements equations (3) to (5). In one embodiment, $\Lambda_{min}$ may be chosen for each sampling phase s separately. Then exponentially spaced thresholds HT(I,s) for the relative frequencies H(i, j, s) are being pre-calculated:

$$HT(1, s) = \frac{10^{\Lambda_{min}(s)}}{2^L - 1}; -64 <= \Lambda_{min}(s) <= -4; s = 1, 2, \ldots S; \quad (6)$$

The other HT(I,s) are calculated iteratively:

$$HT(I,s) = HT(I-1,s) * HT(1,s); I = 2, 3 \ldots 2^L - 1,$$
$$s = 1, 2, \ldots S; \quad (7)$$

Taking of the logarithm is actually done by a look up process which may read in pseudocode:

```
function [bm] = bmc (h, ht)
    bm(1: 2^K) = 2^L-1; // initialize with zero frequency
    metrics
    for k = 1:2^K
        for i = 1: 2^L-1
            j = (64 - i);
            if h(k) > ht(j)
                bm(k) = j - 1;
            end
        end
    end
endfunction
function bma = BMC(H, HT)
    for s = 1:S
        for j = 1:2^M
            bma(:,j,s) = bmc( H(1:2^K,j,s), HT(:,s) );
        end
    end
endfunction
```

The results of this look up process are the "canonical" branch metrics which are stored in an active branch metrics bank $bm_a(1:2^K, 1:2^m, 1:S)$ in metrics scratchpad 115. The metrics scratchpad 115 actually comprises a second set of passive branch metrics $bm_p(1:2^K, 1:2^M, 1:S)$, which are not shown in FIG. 7.

The active branch metrics $bm_a$ may be inventively post-processed by optional post-processor-blocks LER 20, CTE 40 and DDMS 60 encompassed by the metrics post-processing box 100 as described in more detail above. A simple programmable logic allows to configure executing these post-processing algorithms selectively and/or in any sequence. The preferred sequence is LER, CTE, DDMS. FIG. 7 also shows parameters 120, 140 and 160, respectively. Multiplexer 117 selects the output of the active post-processor for returning the process branch metrics to metric scratchpad 115.

As an input, LER 20, CTE 40 and DDMS 60, all need the index of the maximum of the histogram. Index of the maximum of the histogram, mode of the histogram and the above-mentioned minimum metric index m are synonyms. The maxima of the histograms are searched in a process called Histogram Mode Value (HMODE) 118 and stored in m(1:2 K,1:S) 119. The implementation of the HMODE process is fairly simple and implements a complete search in each histogram:

```
function hmode = hmode(h)
    hmode = 0, hmax = 0;
    for i = 1:S
        if h(i) > hmax
            hmode = i, hmax = h(i);
        end
    end
endfunction
function m = HMODE(H)
    for s = 1:S
        for j = 1:2^M
            m(s,1) = hmode( H(1:2^K,j,s) );
        end
    end
endfunction
```

Equivalently (not shown) it is possible to extract the required mode values from the metrics scratchpad, by searching for the locations of the best branch metric. The advantage of computing HMODE from histograms is that it can be done in parallel with BMC 114; moreover HMODE 118 can be refined e.g. by computing the histogram mean (HM, cf. equation (8)) and using this histogram mean suitably rounded as histogram center index m in LER 20, CTE 40 and DDMS 60. This histogram mean might be useful either for a semi-parametric metrics computation method (e.g. in software) or would allow a DDMS variant with resolution finer than an integral bin.

$$HM_{j,s} = \sum_{k=1}^{2^K} k \cdot H_{k,j,s} \tag{8}$$

BMUPDATE 116 is a simple data transfer process that atomically updates the operational metrics 102 from the active metrics scratchpad 115, after the metrics computation (either canonical or canonical with post-processing) is finished.

Simulation Results

We demonstrate the strength of the proposed post-processing methods by presenting some simulation results.

The NRZ transmission of about half a million bits for undispersed optical channel (RD=0 ps/nm) has been simulated. The 16-state MLSE with two samples per bit was used with parameters:

$K=3$, $L=6$, $P_{min}=10^{-12}$, $mst=4$, $mtms=5$, $pmd=1$, and $mmdt(:)=21$.

First simulation was run at OSNR of 11 dB over one unit interval. In this simulation, the methods tend to suppress the effect of errors on building histograms. Main job was done by the LER and CTE.

Another simulation was done at OSNR of 14 dB. The histograms 11110 and 11111 had a "knee" at both sampling phases (1 and 2) as shown below. The MLSE generated 24 errors with a knee, and after post-processing the number of errors dropped to 4. In this case, the main job was done by the CTE. Similar results are observed in real measurements with 4-state MLSE.

TABLE 7

| i | 1 | 2 | 3 | 4 | 5 | 6 | 7 | 8 |
|---|---|---|---|---|---|---|---|---|
| $bm_{i, 1111, 1}$ | 63 | 58 | 37 | 6 | 6 | 4 | 2 | 1 |
| $bm_{i, 1111, 2}$ | 63 | 60 | 39 | 6 | 6 | 4 | 2 | 1 |

As explained above, the metrics indifference results in an error floor that location depends on MLSE construction. For example, the commercial (CoreOptics) oversampled 4-state MLSE using K=3 and L=4 shows an error floor at BER of $10^{-10}$. When the DDMS is used with all elements of the maximum metric delta template mmdt being set to 5 this error floor is eliminated.

Further modifications and variations of the present invention will be apparent to those skilled in the art in view of this description. Accordingly, this description is to be construed as illustrative only and is for the purpose of teaching those skilled in the art the general manner of carrying out the present invention. It is to be understood that the forms of the invention shown and described herein are to be taken as the presently preferred embodiments.

| Reference list | |
|---|---|
| 4 | optical channel |
| 9 | receiver control node |
| 10 | receiver |
| 11 | physical interface 12 AGC or VGA |
| 13 | ADC |
| 14 | clock recovery subsystem |
| 15 | sampling phase adjustment circuit |
| 17 | MLSE |
| 18 | FEC decoder |
| 19 | channel model unit |
| 20 | LER processing |
| 21-39 | steps |
| 40 | CTE processing |
| 41-58 | steps |
| 60 | DDMS processing |
| 61-86 | steps |
| 100 | metrics post-processing box |
| 101 | MMVA |
| 102 | branch metrics storage element |
| 103 | channel state |
| 104 | detected bits |
| 108 | HCNTACC |
| 109 | number of unit intervals to be accumulated |
| 110 | accumulated counter channel model |
| 111 | bin number |
| 112 | HNORM |
| 113 | relative frequency channel model |
| 114 | BMC |
| 115 | metric scratchpad |
| 116 | BMUPDATE |
| 117 | multiplexer |
| 118 | HMODE |
| 119 | modes of histograms |
| 120, 140, 160 | parameters |

The invention claimed is:

1. A method for obtaining a bin number of branch metrics comprising:
providing a histogram comprising a bin number of values, a maximum value and a tail region left or right of said maximum value;
obtaining said bin number of branch metrics from said bin number of values of said histogram; and
removing a local extremum from said tail region.

2. An equalizer for a receiver for receiving digital data, comprising:
a maximum likelihood sequence estimator; and
a processor being electrically connected to said maximum likelihood sequence estimator, said processor for executing the methods defined in claim 1 and providing metrics obtained from said counter values to said maximum likelihood sequence estimator.

3. A method for obtaining a bin number of branch metrics comprising:
providing a histogram comprising a bin number of values, a maximum value and a tail region left or right of said maximum value;
obtaining said bin number of branch metrics from said bin number of values of said histogram; and
forcing said tail region to be convex.

4. The method of claim 3, wherein said providing said histogram comprises:
counting events during a channel estimation period thereby obtaining a bin number of counter values, each event being uniquely associated with a quantized input signal, said bin number of counter values being indexed from 1 to said bin number;
declaring the index of the highest counter value or one of the highest counter values as a maximum counter index;
defining said tail region on one of the left-hand side or right-hand side of said maximum counter index, said tail region on the left-hand side of said maximum counter index ranging from index 1 to a left tail index being smaller than said maximum counter index and said tail region on the right-hand side of the said maximum counter index ranging from a right tail index to said bin number; said right tail index being greater than said maximum counter index.

5. The method of claim 4, wherein said defining of said tail region further requires that the counter value at said left or right tail index is lower than a counter smoothing threshold.

6. A method for obtaining a bin number of branch metrics comprising:
providing a histogram comprising a bin number of values, a maximum value and a tail region left or right of said maximum value;
obtaining said bin number of branch metrics from said bin number of values of said histogram; and
ensuring a maximum metric difference between neighboring branch metrics.

7. The method of claim 6, further comprising:
mapping each of said values of said histogram to a branch metric, thereby obtaining said bin number of branch metrics, the branch metrics being indexed from 1 to said bin number, each branch metric being represented by an integer binary value having a metric bit number of bits, the branch metrics being limited to a range from 0 to a metric high value, said metric high value being ($2^{metric\ bit\ number}-1$) and said branch metric being a truncated logarithm of the quotient of the sum of all counter values divided by the counter value to be mapped.

8. The method of claim 7, further comprising one of:
repeating for an index k within the tail region on the left-hand side of a maximum counter index, the index i being decremented by 1 after each repetition:
comparing the metric at index k with the metric at an index k+1; and
setting all metrics having an index smaller than or equal to the index k to said metric high value, if the metric at index k is smaller than or equal to the metric at index k+1; or
repeating for the index k within the tail region on the right-hand side of said maximum counter index, the index i being incremented by 1 after each repetition:
comparing the metric at index k with the metric at an index k−1; and
setting all metrics having an index greater than or equal to the index k to said metric high value, if the metric at index k is smaller than or equal to the metric with index k−1.

9. The method of claim 8, wherein the left tail index is equivalent to the difference of said maximum counter index minus a tail distance or said right tail index is equivalent to the sum of said maximum counter index plus said tail distance.

10. The method of claims 7, further comprising one of:
repeating for an index i within the tail region on the left-hand side of a maximum counter index, the index i being decremented by 1 after each repetition:
calculating a minimum metric at index i, said minimum metric being the metric at index i+1 plus a metric delta parameter plus the maximum of the difference of the metric at index i+1 minus the metric at index i+2 and a minimum tail metric slope parameter; and replacing the metric at index i by a minimum metric at index i if said minimum metric at index i is both smaller than a metric high value and greater than the metric at index i; or repeating for the index i within the tail region on the right-hand side (of said maximum counter index, the index i being incremented by 1 after each repetition:

calculating a minimum metric at index i, said minimum metric being the metric at index i−1 plus a metric delta parameter plus the maximum of the difference of the metric at index i−1 minus the metric at index i−2 and a minimum tail metric slope parameter; and replacing the metric at index i by said minimum metric at index i, if said minimum metric at index i is both smaller than a metric high value and greater than the metric at index i.

11. The method of claim 7, further comprising:
comparing neighboring metrics;
replacing the metric at index o with the sum of metric at index plus a predefined maximum metric difference at index o, if said sum of metric at index plus a predefined maximum metric difference at index o is smaller than the metric at index o; and replacing gthe metric at index o with the sum of metric at index (o+1) plus a predefined maximum metric difference at index o, if said sum of metric at index (o+1) plus a predefined maximum metric difference at index o is smaller than the metric at index o.

12. The method of claim 11, further comprising:
declaring the index of the highest counter value or one of the highest counter values as a maximum counter index;
initializing said maximum metric difference from a maximum metric difference template by repeating for the index n starting from 1 to said maximum counter index; and setting said maximum metric difference at index n equivalent to said maximum metric difference template at an index being the absolute value of a difference of said highest counter value minus said index n.

* * * * *